(12) United States Patent
Michalak et al.

(10) Patent No.: US 10,600,957 B2
(45) Date of Patent: Mar. 24, 2020

(54) METHOD FOR FABRICATING SPIN LOGIC DEVICES FROM IN-SITU DEPOSITED MAGNETIC STACKS

(71) Applicant: INTEL CORPORATION, Santa Clara, CA (US)

(72) Inventors: David Michalak, Portland, OR (US); Sasikanth Manipatruni, Hillsboro, OR (US); James Clarke, Portland, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 15/519,810

(22) PCT Filed: Dec. 18, 2014

(86) PCT No.: PCT/US2014/071220
§ 371 (c)(1),
(2) Date: Apr. 17, 2017

(87) PCT Pub. No.: WO2016/099516
PCT Pub. Date: Jun. 23, 2016

(65) Prior Publication Data
US 2017/0256707 A1 Sep. 7, 2017

(51) Int. Cl.
*H01L 43/10* (2006.01)
*G01R 33/12* (2006.01)
(Continued)

(52) U.S. Cl.
CPC ............ *H01L 43/10* (2013.01); *G01D 5/2033* (2013.01); *G01R 33/1284* (2013.01);
(Continued)

(58) Field of Classification Search
None
See application file for complete search history.

(56) References Cited

U.S. PATENT DOCUMENTS

2006/0139817 A1  6/2006  Inomata et al.
2009/0057654 A1*  3/2009  Saito ............... B82Y 25/00
                                              257/39

(Continued)

FOREIGN PATENT DOCUMENTS

JP    2000101164    4/2000
JP    2001332781    11/2001
WO   2012090474    6/2014

OTHER PUBLICATIONS

Non-Final Office Action from Chinese Patent Application No. 20140083526.9 dated Apr. 3, 2019, 15 pgs.
(Continued)

*Primary Examiner* — Kevin M Bernatz
(74) *Attorney, Agent, or Firm* — Green, Howard & Mughal LLP

(57) ABSTRACT

Described is a method comprising: forming a magnet on a substrate or a template, the magnet having an interface; and forming a first layer of non-magnet conductive material on the interface of the magnet such that the magnet and the layer of non-magnet conductive material are formed in-situ. Described is an apparatus comprising: a magnet formed on a substrate or a template, the magnet being formed under crystallographic, electromagnetic, or thermodynamic conditions, the magnet having an interface; and a first layer of non-magnet conductive material formed on the interface of the magnet such that the magnet and the layer of non-magnet conductive material are formed in-situ.

18 Claims, 10 Drawing Sheets

(51) Int. Cl.
  G11B 5/39    (2006.01)
  H01L 43/08   (2006.01)
  H01L 43/12   (2006.01)
  G01D 5/20    (2006.01)
  H01L 43/02   (2006.01)

(52) U.S. Cl.
  CPC .............. *H01L 43/02* (2013.01); *H01L 43/08* (2013.01); *H01L 43/12* (2013.01); *G11B 5/3993* (2013.01); *G11B 2005/3996* (2013.01)

(56) References Cited

U.S. PATENT DOCUMENTS

| | | | |
|---|---|---|---|
| 2011/0049656 A1* | 3/2011 | Li | G11C 11/16 257/421 |
| 2011/0084429 A1 | 4/2011 | Fesler | |
| 2012/0176154 A1 | 7/2012 | Behin-Aein et al. | |
| 2012/0248556 A1* | 10/2012 | Nikonov | H01L 27/22 257/421 |
| 2013/0078482 A1 | 3/2013 | Shukh | |
| 2013/0302649 A1 | 11/2013 | Takahashi et al. | |
| 2014/0210025 A1* | 7/2014 | Guo | A63F 13/10 257/421 |
| 2014/0327095 A1 | 11/2014 | Kim et al. | |
| 2015/0001601 A1* | 1/2015 | Koike | H01L 43/02 257/295 |
| 2016/0118578 A1* | 4/2016 | Park | H01L 43/12 438/3 |

OTHER PUBLICATIONS

International Preliminary Report on Patentability dated Jun. 29, 2017 for PCT Patent Application No. PCT/US14/71220.

International Search Report and Written Opinion for International Patent Application No. PCT/US2014/071220, dated Sep. 10, 2015.

Extended European Search Report from European Patent Application No. 14908600.1 dated Jul. 17, 2018, 7 pgs.

Non-Final Office Action from European Patent Application No. 14908600.1 dated Jun. 17, 2019, 4 pgs.

Non-Final Office Action from Taiwan Patent Application No. 104137901 dated May 30, 2019, 9 pgs.

* cited by examiner

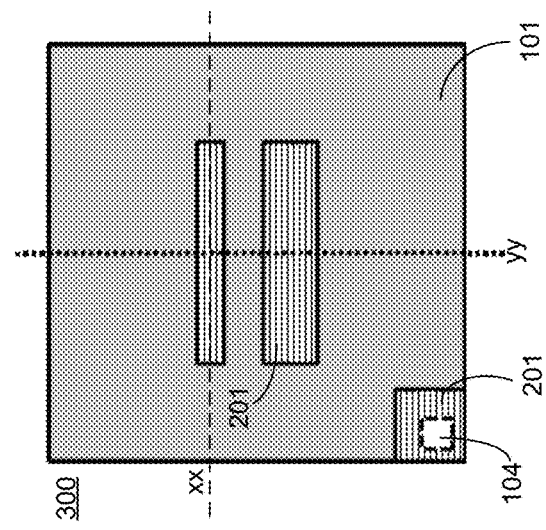
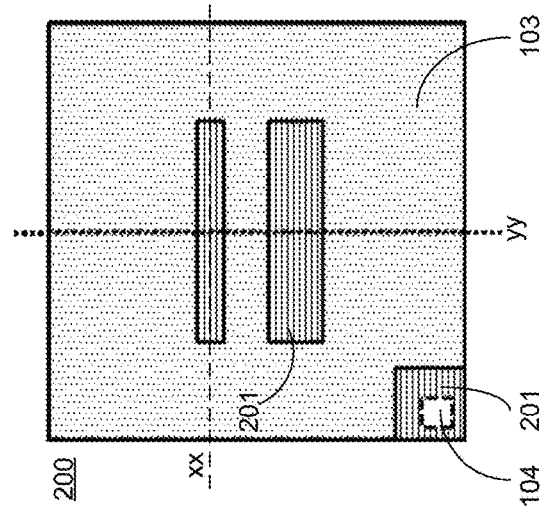
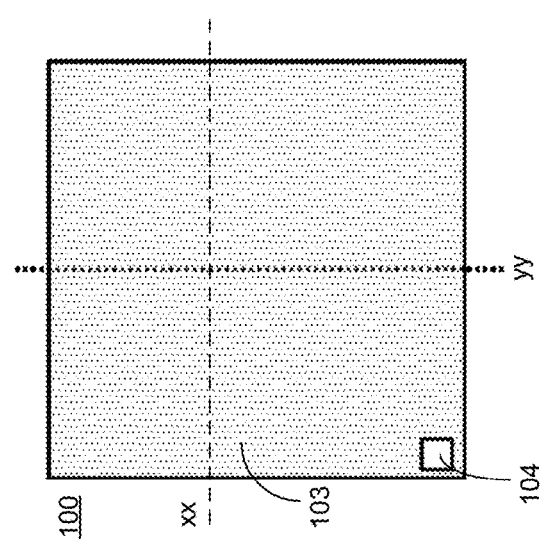
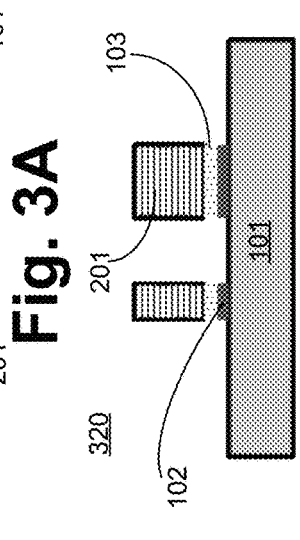
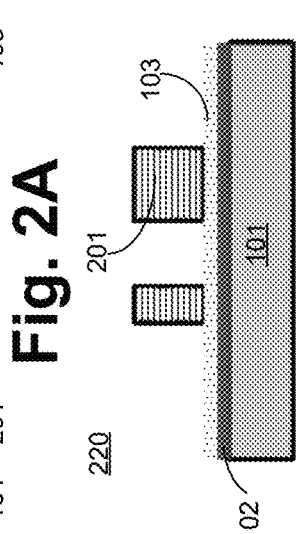
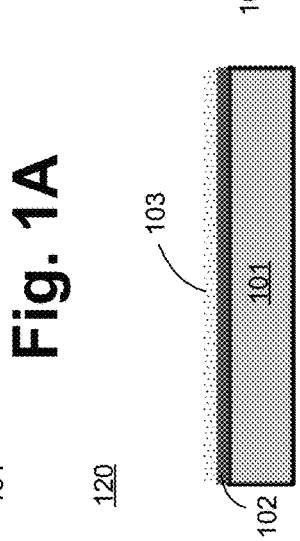
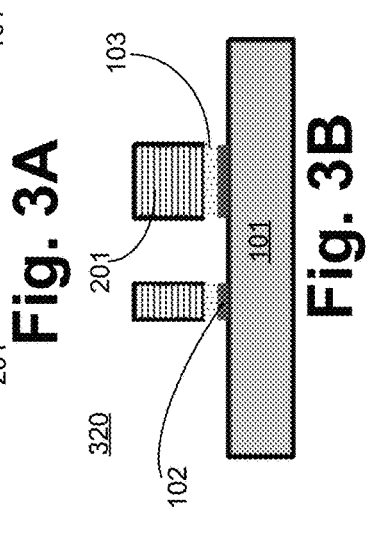
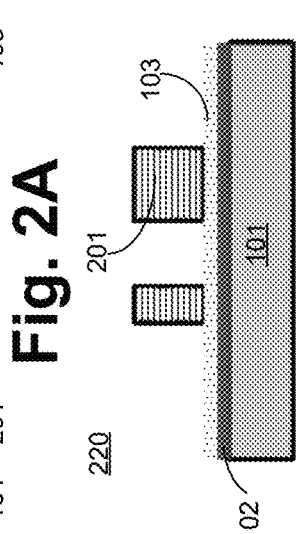
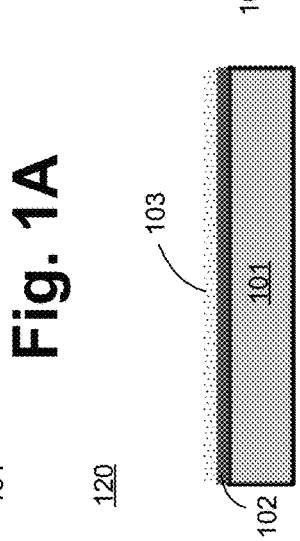
Fig. 1A   Fig. 2A   Fig. 3A
Fig. 1B   Fig. 2B   Fig. 3B
Fig. 1C   Fig. 2C   Fig. 3C

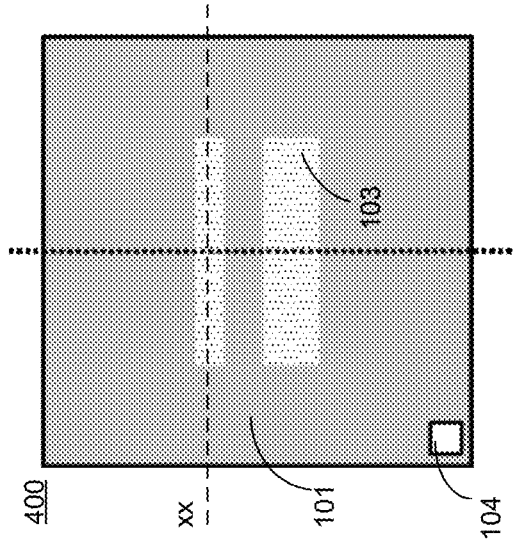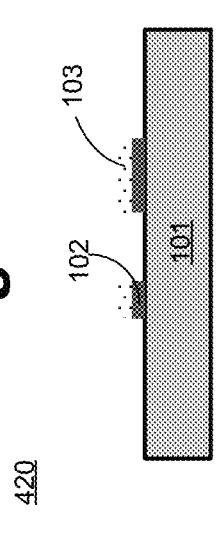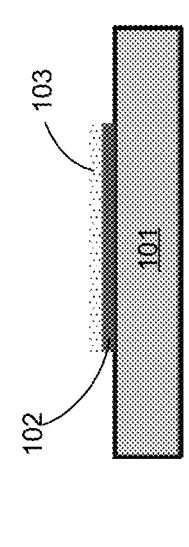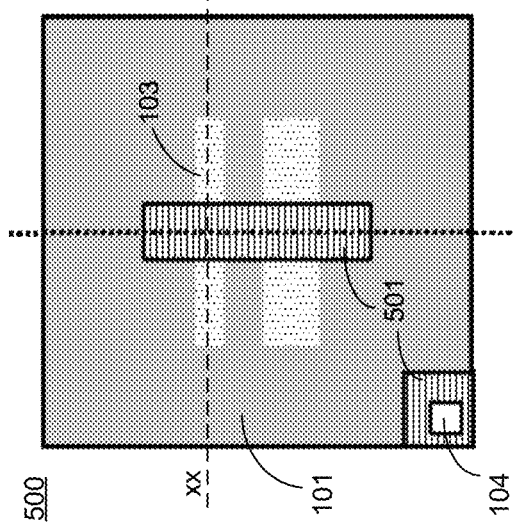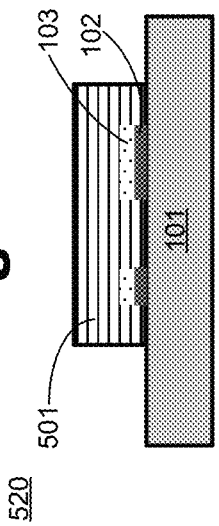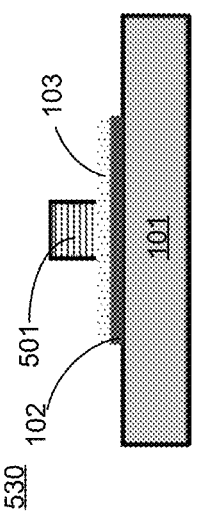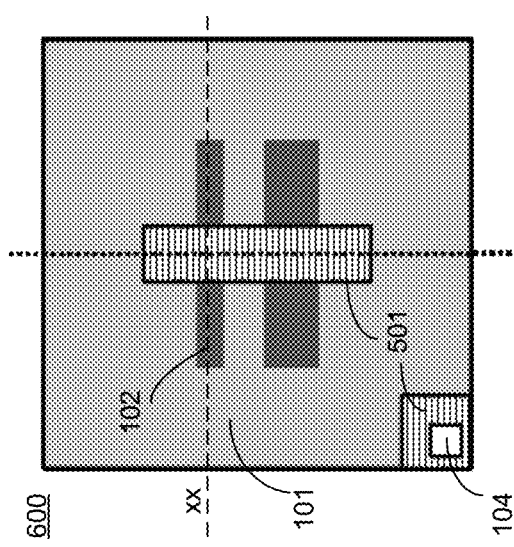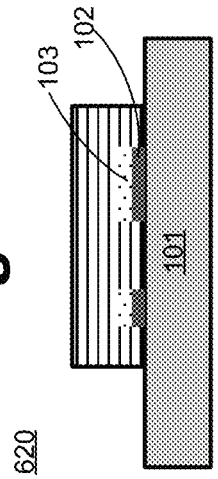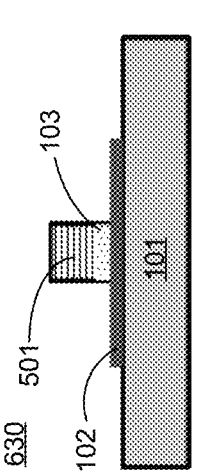

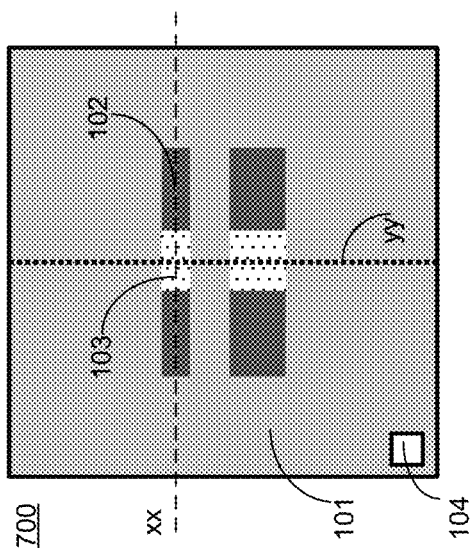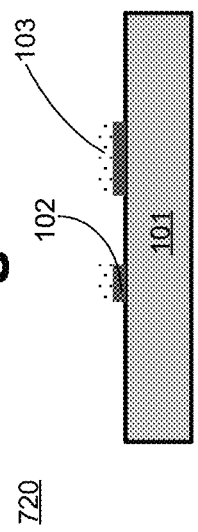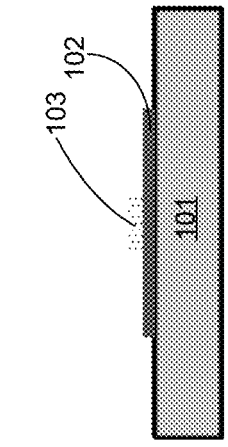
Fig. 7A  Fig. 7B  Fig. 7C
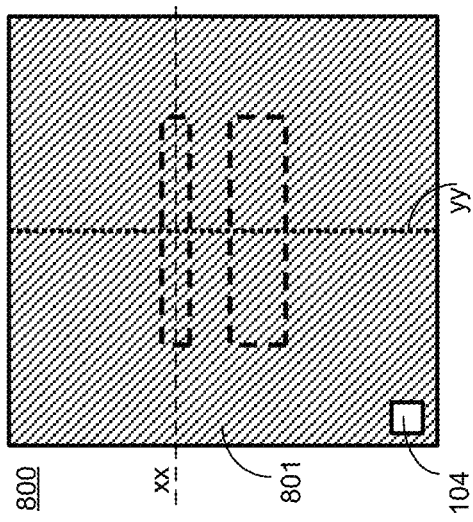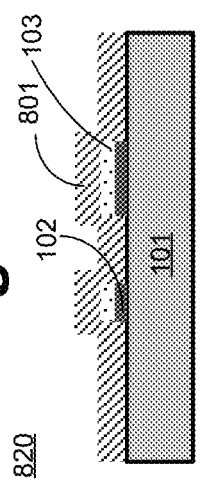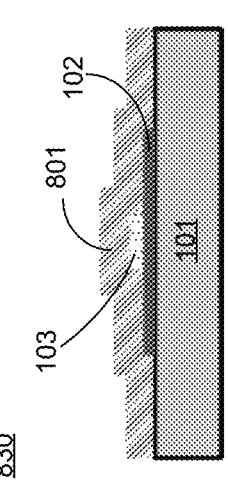
Fig. 8A  Fig. 8B  Fig. 8C
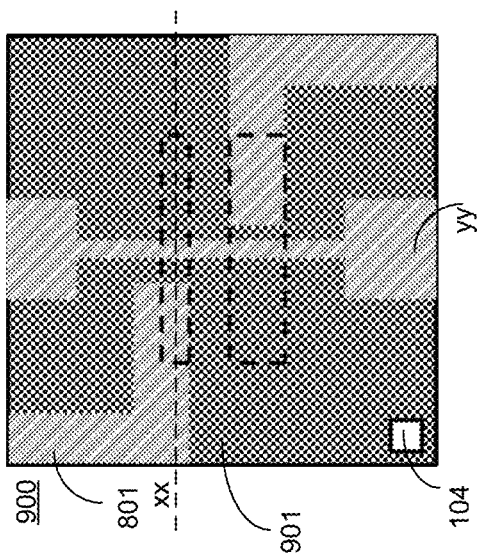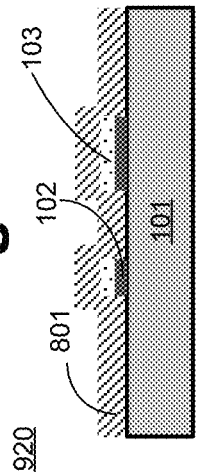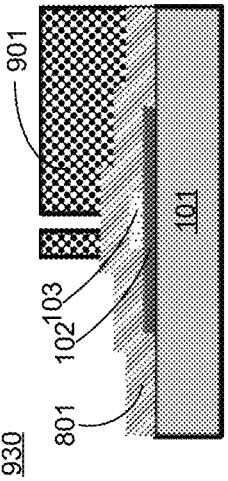
Fig. 9A  Fig. 9B  Fig. 9C

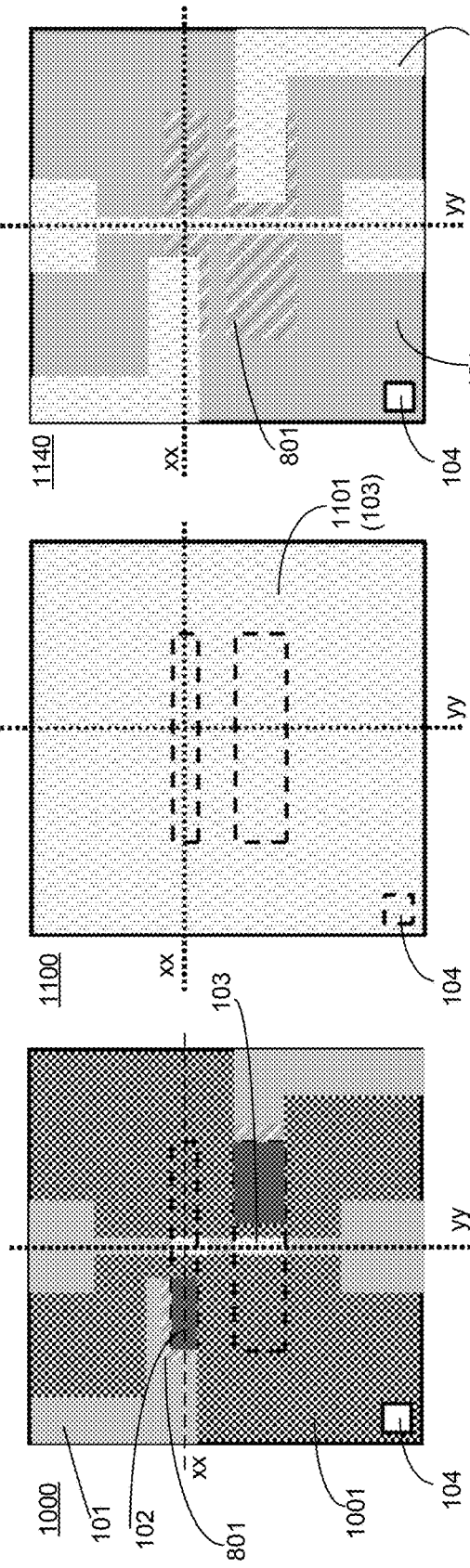
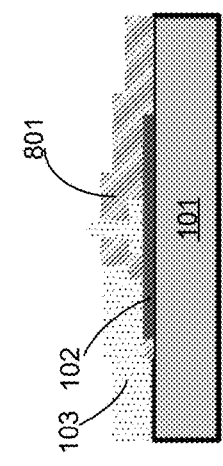
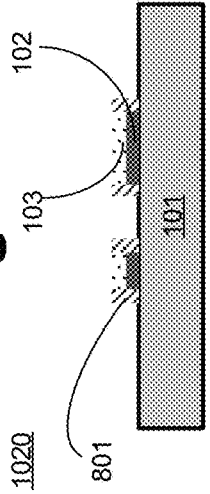
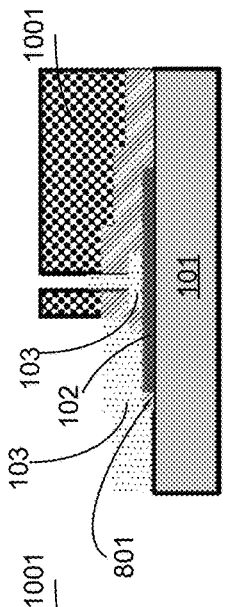
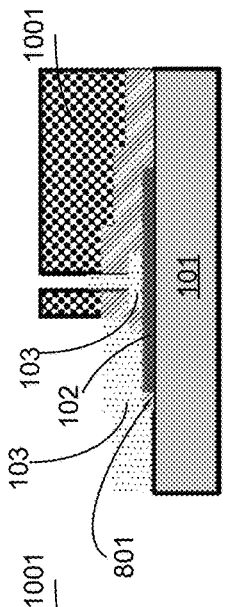
Fig. 10A Fig. 11A Fig. 11D
Fig. 10B Fig. 11B Fig. 11E
Fig. 10C Fig. 11C Fig. 11F

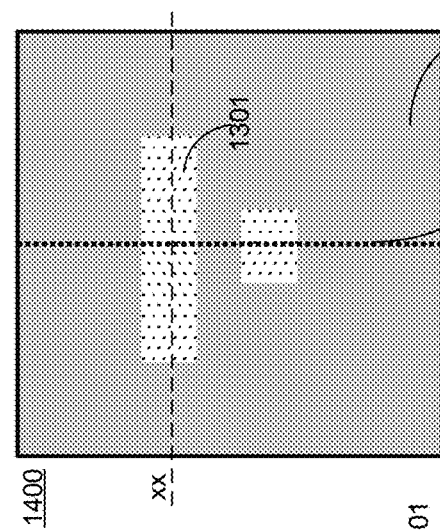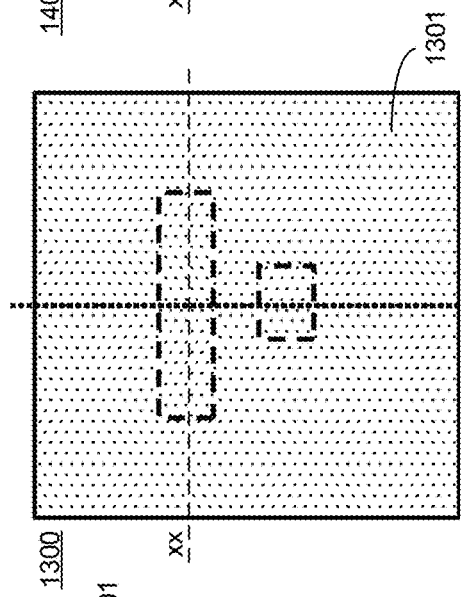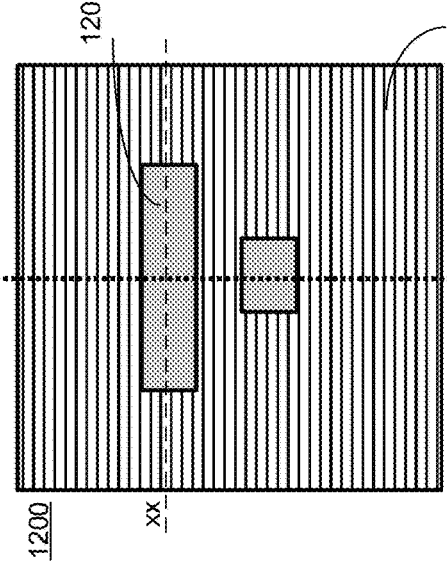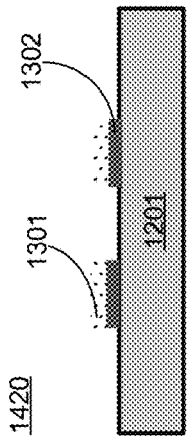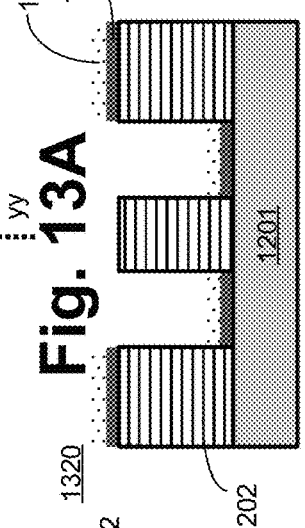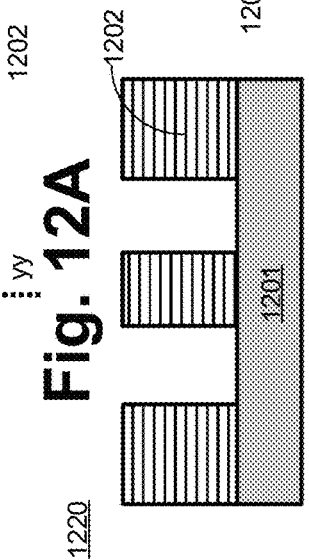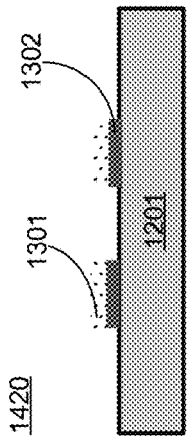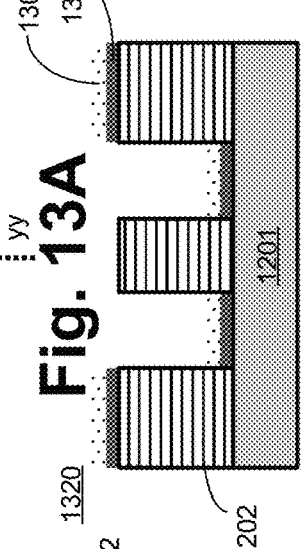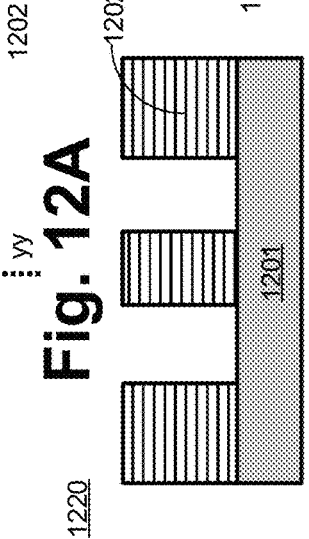
Fig. 12A  Fig. 13A  Fig. 14A
Fig. 12B  Fig. 13B  Fig. 14B
Fig. 12C  Fig. 13C  Fig. 14C

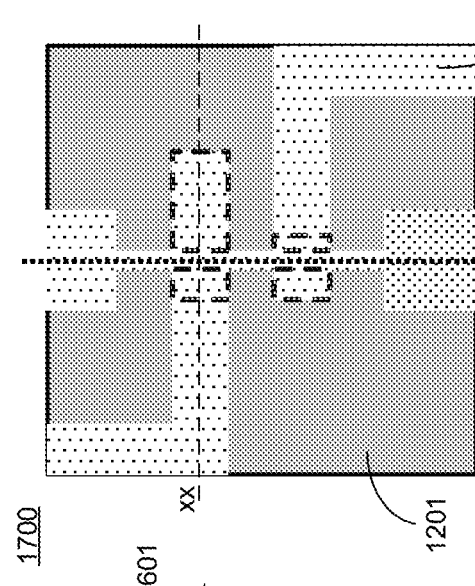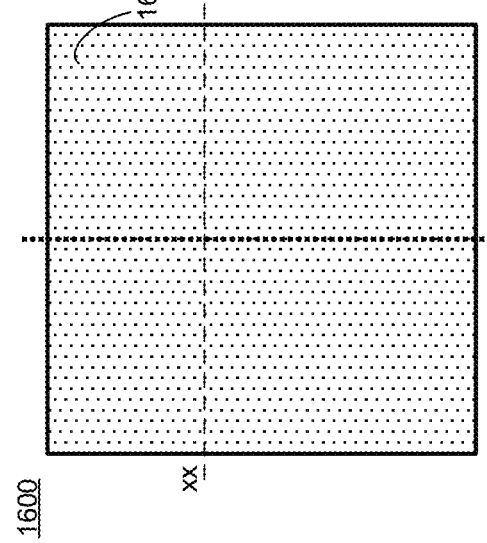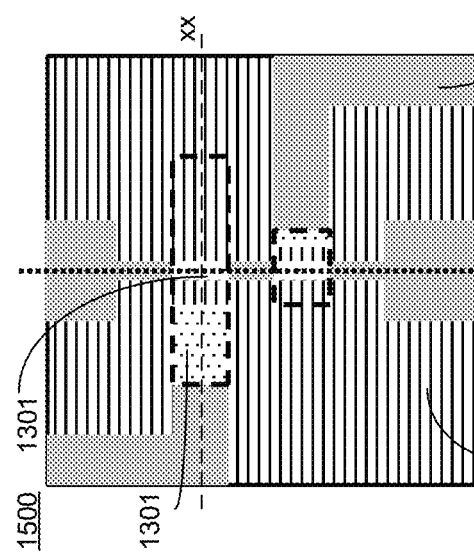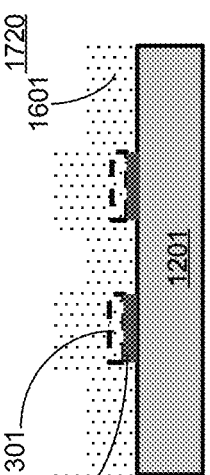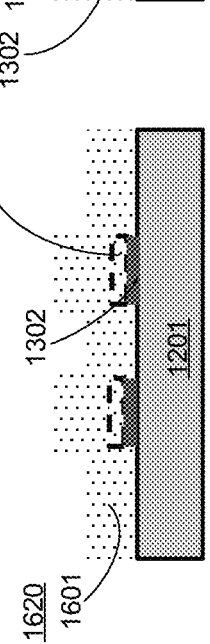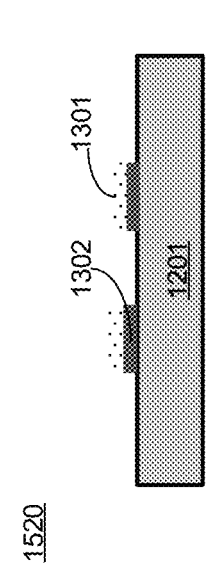

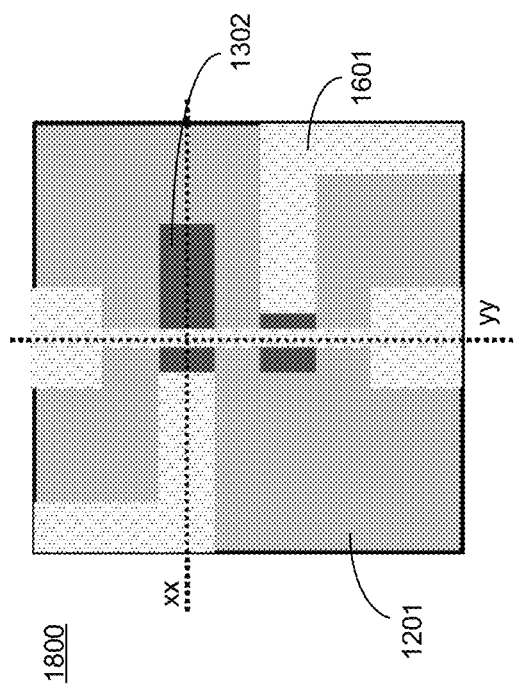
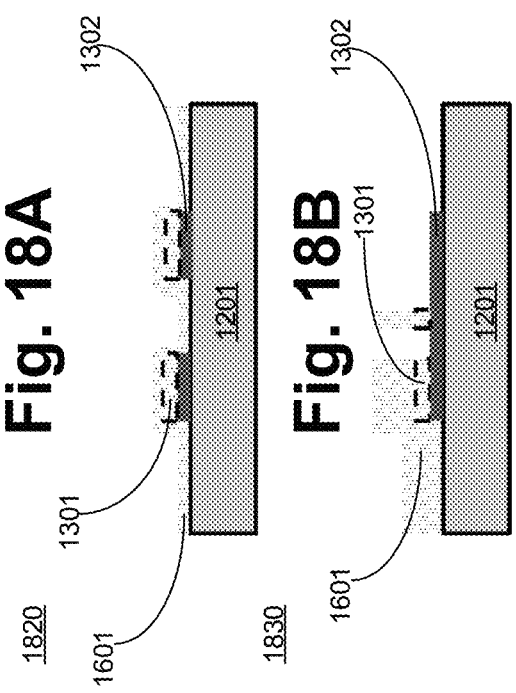
Fig. 18A  Fig. 18B  Fig. 18C

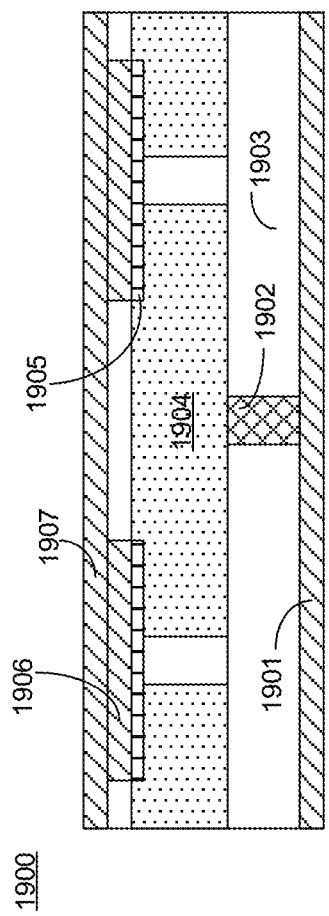
Fig. 19A
Fig. 19B
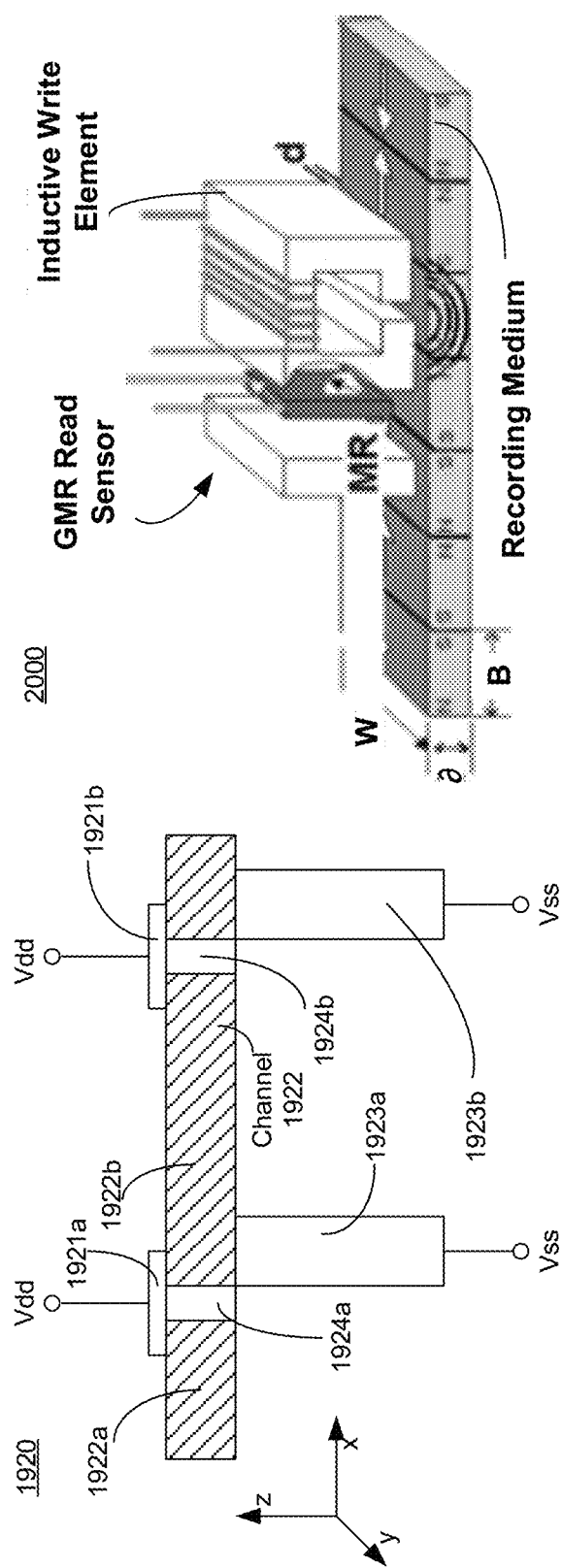
Fig. 20

$X_2YZ$

Co-Fe/GeGa interface

METHOD FOR FABRICATING SPIN LOGIC DEVICES FROM IN-SITU DEPOSITED MAGNETIC STACKS

CLAIM OF PRIORITY

This Application is a National Stage Entry of, and claims priority to, PCT Application No. PCT/US2014/071220, filed on 18 Dec. 2014 and titled "METHOD FOR FABRICATING SPIN LOGIC DEVICES FROM IN-SITU DEPOSITED MAGNETIC STACKS," which is incorporated by reference in its entirety for all purposes.

BACKGROUND

Spin logic can enable a new class of computing circuits and architectures for the beyond Complementary Metal Oxide Semiconductor (CMOS) computing circuits and architectures. However, existing experimental demonstrations of spin logic devices suffer from low spin injection efficiency due to the requirement for an air break during the deposition of critical spin injection layers, and due to reliance on multi-angle deposition with a mask-in-chamber flow (where deposition is done with a non-contact mask, and where different geometries are obtained via multi-angle deposition). These existing processes suffer from low interface quality (i.e., interface quality is rough) and thus low injected spin polarization. These existing processes also suffer from the difficulty to integrate such processes into a High Volume Manufacturing (HVM) process.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 1A-C illustrate top and side views of a stack of substrate with magnet and non-magnet conductive layer formed in-situ, according to some embodiments of the disclosure.

FIGS. 2A-C illustrate top and side views of the stack with positive resist pattern deposition, according to some embodiments of the disclosure.

FIGS. 3A-C illustrate top and side views of the stack after the positive resist is etched selectively, according to some embodiments of the disclosure.

FIGS. 4A-C illustrate top and side views of the stack after the positive resist is removed, according to some embodiments of the disclosure.

FIGS. 5A-C illustrate top and side views of the stack with channel and pad resist deposition, according to some embodiments of the disclosure.

FIGS. 6A-C illustrate top and side views of the stack with selective etching of the non-magnet conductive material, according to some embodiments of the disclosure.

FIGS. 7A-C illustrate top and side views of the stack with channel and pad resist being removed, according to some embodiments of the disclosure.

FIGS. 8A-C illustrate top and side views of the stack with conformal dielectric layer deposition to prevent current going through the etched magnet sidewalls to the channel, according to some embodiments of the disclosure.

FIGS. 9A-C illustrate top and side views of the stack with channel and pad resist deposition, according to some embodiments of the disclosure.

FIGS. 10A-C illustrate top and side views of the stack with timed etch to expose Conformal Dielectric Layer (ILD) on top of the non-magnet conductive layer without etching the magnet sidewalls, according to some embodiments of the disclosure.

FIGS. 11A-C illustrate top and side views of the stack with channel and pad deposition, according to some embodiments of the disclosure.

FIGS. 11D-F illustrate top and side views of the stack after resist lift-off, according to some embodiments of the disclosure.

FIGS. 12A-C illustrate top and side views of a stack having a substrate with resist disposition, according to some embodiments of the disclosure.

FIGS. 13A-C illustrate top and side views of the stack with magnet and thin channel deposition, according to some embodiments of the disclosure.

FIGS. 14A-C illustrate top and side views of the stack after lift-off, according to some embodiments of the disclosure.

FIGS. 15A-C illustrate top and side views of the stack after resist deposition and selective etching to form patterns for channel and pad, according to some embodiments of the disclosure.

FIGS. 16A-C illustrate top and side views of the stack after thick channel metal deposition, according to some embodiments of the disclosure.

FIGS. 17A-C illustrate top and side views of the stack after lift-off of region defined by the resist deposition, according to some embodiments of the disclosure.

FIGS. 18A-C illustrate top and side views of the stack after selective etch of non-magnet conductive material, according to some embodiments of the disclosure.

FIG. 19A illustrates a side view of a lateral spin logic device side enabled in-situ process flow, according to some embodiments of the disclosure.

FIG. 19B illustrates a bit schematic view of the lateral spin logic device (e.g., an ASL device) of FIG. 19A enabled by the in-situ process, according to some embodiments of the disclosure.

FIG. 20 illustrates a low width lateral spin valve used as a read head sensor enabled by the in-situ process, according to some embodiments of the disclosure.

DETAILED DESCRIPTION

Figure 21B:
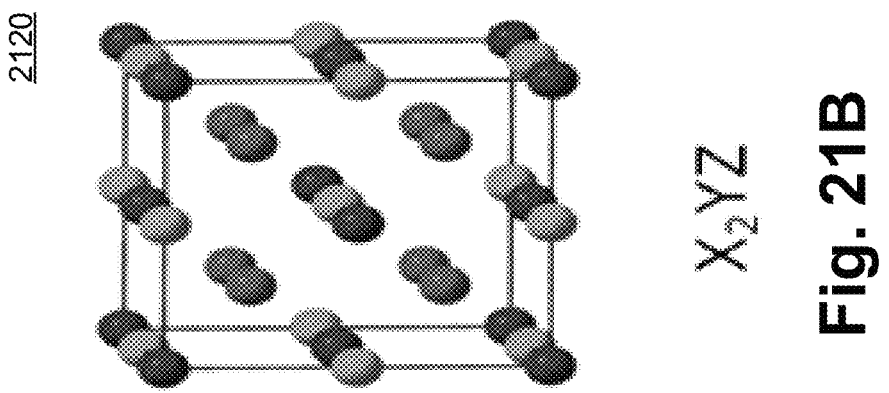
FIGS. 21A-B illustrates formation of a magnetic texture that can be detected using Transmission Electron Microscopy (TEM).

Current processing of magnetic thin files in non-local spin valve geometries needs air exposure for patterning after the deposition of the magnetic layer and before the deposition of the channel. This air break leads to surface oxidization on the magnet. An incomplete removal of the oxide and/or aggressive treatments used to remove surface oxidization results in lower spin injection efficiencies into the channel material.

One method to fabricate a non-lateral spin valve device is to use a two-step process. In the first step, a magnetic layer is deposited into a patterned resist followed by lift-off and cleaning. In the second step, a resist is patterned on top of the magnetic layer for deposition of the channel material. In this process, the surface of the magnet is oxidized during processing and must be removed in-situ with a surface treatment prior to the deposition of the channel material. In this process, the resulting magnet/channel (after oxidization is removed) provides a poor interface quality relative to immediate deposition of the two material sequentially in vacuum.

Another method to fabricate non-lateral spin valve device is to deposit the magnet followed by in-situ channel deposition. In this method, to achieve the necessary patterning, the deposition needs to be very shallow and angles for incoming beams for deposition need to be controlled carefully in order to control the placement of the two materials into the necessary geometry. The shallow and controlled angles are not practical for HVM.

Some embodiments described here are formed from a method which is independent of an air break for patterning one layer before depositing the next i.e., an in-situ processing method. The term "in-situ" here generally refers to no air break (e.g., in vacuum conditions) and a continuous thermodynamic, crystallographic, or electromagnetic conditioning during material formation. The term "in-situ" also refers to the magnet and metal cap both being deposited in the same vacuum chamber ("in-situ"). The term "ex-situ" generally refers to when the magnet is deposited, removed to air, oxide grows, and then the device is later coated with the channel or cap material (either in vacuum or in another condition). The "in-situ" part prevents the oxidation or roughening of the magnet surface that can occur when it leaves the safety of ultra-high vacuum. Some embodiments describe a processing method that does not need (i.e., independent of) multi-angle deposition.

In some embodiments, the process based on in-situ processing of magnetic spin valves is a subtractive process flow that works with in-situ deposited magnet/spin channel stacks. In some embodiments, the process begins with an in-situ deposited substrate or template where the magnet is formed in its ideal crystallographic, thermodynamic, or electromagnetic conditions. In some embodiments, the magnet's interface is protected or preserved in-situ with a layer of a known non-magnet conductive channel or capping material. In some embodiments, a stack of layers (conductive and/or non-conductive) are subtractively patterned on the substrate such that the critical magnet/channel interface through which spin polarized currents flow is not exposed to air or chemically modified.

There are many technical effects of the various embodiments. For example, the method of in-situ processing of magnetic spin valves preserves the quality of the interface between a magnetic material (which is used for spin polarization) and a channel (a non-magnetic material used for transmission of spin-polarized electrons). The method of in-situ processing of magnetic spin valves also enables the use of magnetic stacks with other advanced materials. The method of in-situ processing of magnetic spin valves described with reference to some embodiments enables a wide class of magnetic logic and sensing devices. For example, the method of in-situ processing can be used to form lateral spin logic devices, a low width lateral spin value used as a read head sensor, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or magnetic connection between the things that are connected, without any intermediary devices. The term "coupled" means either a direct electrical or magnetic connection between the things that are connected or an indirect connection through one or more passive or active intermediary devices. The term "circuit" means one or more passive and/or active components that are arranged to cooperate with one another to provide a desired function. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIGS. 1-12 together describe a process flow that uses in-situ deposited magnet/spin channel stacks that allows for preservation (or protection) of the quality of the interface between a magnetic material (used for spin polarization) and a channel (a non-magnetic material used for transmission of spin-polarized electrons), according to some embodiments. Each figure shows a top and side view of the stack after a certain process is complete.

Although FIGS. 1-12 are shown in a particular order, the order of the actions can be modified. Thus, the illustrated embodiments can be performed in a different order, and some processes may be performed in parallel. Some of the processes and/or operations listed in FIGS. 1-12 are optional in accordance with certain embodiments. The numbering of the figures presented is for the sake of clarity and is not intended to prescribe an order of operations in which the various processes must occur. Additionally, operations from the various process flows may be utilized in a variety of combinations.

FIGS. 1A-C illustrate top view 100 and side views (120 and 130) respectively of a stack of substrate with magnet and non-magnet conductive layer formed in-situ, according to some embodiments of the disclosure. Here, side view 120 in FIG. 1B is along the "yy" dotted line, and side view 130 in FIG. 1C is along the "xx" dotted line shown in top view 100 of FIG. 1A.

In some embodiments, the process of forming a lateral spin logic device begins with an in-situ deposited stack. In some embodiments, the in-situ deposited stack comprises a substrate or template 101, magnet 102, and non-magnet conductive material 103. In some embodiments, magnet 102 and non-magnet conductive material 103 (also referred here as the magnet cap, or first non-magnet conductive material) are patterned together. This step protects the in-situ spin interface from the magnet to the channel. In some embodiments, when the stack is provided, an alignment mark 104 is formed on top of non-magnet conductive material 103. One purpose of the alignment mark 104 is to provide a reference to locations of layers on the stack.

In some embodiments, after magnet cap 103 is formed on magnet 102, the structure is annealed. For example, the structure having magnet 102 and magnet cap 103 is heated to 300 to 400 degree Celsius for a few minutes to fix any defect in the interface between magnet 102 and magnet cap 103 (i.e., magnet interface is reformed to smooth the interface between magnet 102 and magnet cap 103). In some embodiments, the process of annealing is performed after the entire structure is formed.

Examples of materials used to form substrate or template 101 (e.g., 30 nm in thickness) include one of: SiO2, MgO, STO, BFO, Ag, GdScO$_3$, Nb:STO, DyScO$_3$, etc. Examples of materials used to form magnet 102 include one of: Heusler alloys (e.g., Cu$_2$MnAl, Cu$_2$MnIn, Cu$_2$MnSn, Ni$_2$MnAl, Ni$_2$MnIn, Ni$_2$MnSn, Ni$_2$MnSb, Ni$_2$MnGa, Co$_2$MnAl, Co$_2$MnSi, Co$_2$MnGa, Co$_2$MnGe, Pd$_2$MnAl, Pd$_2$MnIn, Pd$_2$MnSn, Pd$_2$MnSb, Co$_2$FeSi, Co$_2$FeAl, Fe$_2$Val, Mn$_2$VGa, Co$_2$FeGe, etc.), or ferromagnetic materials (e.g., Co, Fe, Fe$_2$O$_3$, FeOFe$_2$O$_3$, NiOFe$_2$O$_3$, CuOFe$_2$O$_3$, MgOFe$_2$O$_3$, MnBi, Ni, MnSb, MnOFe$_2$O$_3$, Y$_3$Fe$_5$O$_{12}$, CrO$_2$, MnAs, Gd, Dy, Eu, etc.), etc. Examples of non-magnet conductive material 103 include one of: Cu, Ag, Al, Au, Bi, BiSe, BiAu, Cu alloyed or doped with Ir, Os, Bi, or Si.

FIGS. 2A-C illustrate top view 200 and side views (220 and 230) of the stack with positive resist pattern deposition, according to some embodiments of the disclosure. It is pointed out that those elements of FIGS. 2A-C having the same reference numbers (or names) as the elements of any other figure can operate or function in any manner similar to that described, but are not limited to such. Here, side view 220 in FIG. 2B is along the "yy" dotted line, and side view 230 in FIG. 2C is along the "xx" dotted line shown in top view 200 of FIG. 2A.

In some embodiments, after the in-situ deposited stack is provided, a positive photo resist pattern 201 is formed on the non-magnet conductive material 103. In this example, positive photo resist pattern 201 is formed over the alignment mark 104 and the central region as two horizontal bars perpendicular to the "yy" dotted line. In some embodiments, negative photoresist may be used instead of positive photo resist. In such embodiments, instead of exposing the area defined by where the material stays, all the other area is exposed. For a lithography, mask-based Ultra-Violet (UV) exposure using negative photoresist can be used. In some embodiments, positive photo resist pattern 201 identifies the regions of the magnet "bars." In this example, two magnet bar regions are identified by positive photo resist pattern 201. In later processes described here, a conductive channel is formed over the magnetic bars.

FIGS. 3A-C illustrate top view 300 and side views (320 and 330) of the stack after positive resist 201 is etched selectively, according to some embodiments of the disclosure. It is pointed out that those elements of FIGS. 3A-C having the same reference numbers (or names) as the elements of any other figure can operate or function in any manner similar to that described, but are not limited to such. Here, side view 320 in FIG. 3B is along the "yy" dotted line, and side view 130 in FIG. 3C is along the "xx" dotted line shown in top view 300 of FIG. 3A.

In some embodiments, after the pattern of positive photo resist 201 is formed, selective etching is performed to etch regions outside of the positive photo resist 201 down to substrate 101 (i.e., selective regions of magnet 102 and non-magnet conductive material 103 are etched) to identify magnet dimensions. In this example, one magnet is thinner than the other magnet. In other embodiments, different shapes and sizes for the magnets can be achieved.

FIGS. 4A-C illustrate top 400 and side views (420 and 430) of the stack after positive resist 201 is removed, according to some embodiments of the disclosure. It is pointed out that those elements of FIGS. 4A-C having the same reference numbers (or names) as the elements of any other figure can operate or function in any manner similar to that described, but are not limited to such. Here, side view 420 in FIG. 4B is along the "yy" dotted line, and side view 430 in FIG. 4C is along the "xx" dotted line shown in top view 400 of FIG. 4A.

In some embodiments, after selective etching of non-magnet conductive layer 103 and magnet 102, positive photo resist 201 is removed which leaves behind magnetic bars 102 with corresponding non-magnet non-conductive layers 103 exposed.

FIGS. 5A-C illustrate top 500 and side views (520 and 530) of the stack with channel and pad resist deposition, according to some embodiments of the disclosure. It is pointed out that those elements of FIGS. 5A-C having the same reference numbers (or names) as the elements of any other figure can operate or function in any manner similar to that described, but are not limited to such. The side view 520 in FIG. 5B is along the "yy" dotted line, and side view 430 in FIG. 5C is along the "xx" dotted line shown in top view 500 of FIG. 5A.

In some embodiments, channel and/or pad photo resist 501 is deposited over the non-magnet conductive material 103. In this example, preparation is made to form a channel over the in-situ stack (i.e., magnetic bars 102 and non-magnet non-conductive layers 103).

FIGS. 6A-C illustrate top view 600 and side views (620 and 630) of the stack with selective etching of non-magnet conductive material 103, according to some embodiments of the disclosure. It is pointed out that those elements of FIGS. 6A-C having the same reference numbers (or names) as the elements of any other figure can operate or function in any manner similar to that described, but are not limited to such. Here, side view 620 in FIG. 6B is along the "yy" dotted line through the middle of the stack shown in top view 600 of FIG. 6A, while side view 630 in FIG. 6C is along the "xx" dotted line.

In some embodiments, non-magnet conductive layer 103 (i.e., the protective layer or magnet cap) is selectively etched (e.g., using wet etching or dry etching techniques) to expose portions of the top of magnet 102 in areas outside of the channel and/or pad positive resist 501. In this example, the channel-seed is etched to remove the protective layer on the magnet where the magnet does not contact the spin channel or interconnect pads.

Here, 103 is the magnet cap layer. In some embodiments, magnet cap layer 103 is of the same material as the channel, or possibly something different. In some embodiments, material for magnet cap layer 103 is non-magnetic. In some embodiments, material for magnet cap layer 103 has a low atomic number so that there may not be a lot of spin orbit coupling. In such embodiments, processing with minimal oxidation can survive and can preserve a good interface between the magnet and itself. The process of etching, in some embodiments, is done to prevent shorting of the pad contacts to the channel and shunt out the current path through the magnet. The process described with reference to FIGS. 4-6 define the interface non-magnet conductive layer 103.

FIGS. 7A-C illustrate top view 700 and side views (720 and 730) of the stack with channel and pad resist being removed, according to some embodiments of the disclosure. It is pointed out that those elements of FIGS. 7A-C having the same reference numbers (or names) as the elements of any other figure can operate or function in any manner similar to that described, but are not limited to such. Here, side view 720 in FIG. 7B is along the "yy", and side view 730 in FIG. 7C is along the "xx" dotted line shown in top view 700 of FIG. 7A.

In this process, the mechanical position of the channel and the pads are defined with alignment to the exposed in-situ non-magnet conductive layer 103. In some embodiments, channel and/or pad positive resist 501 is removed which exposes the non-magnet conductive layer 103 along the to-be formed channel region.

FIGS. 8A-C illustrates top view 800 and side views (820 and 830) of the stack with conformal dielectric layer deposition to prevent current going through the etched magnet sidewalls to the channel, according to some embodiments of the disclosure. It is pointed out that those elements of FIGS. 8A-C having the same reference numbers (or names) as the elements of any other figure can operate or function in any manner similar to that described, but are not limited to such. Here, side view 820 in FIG. 8B is along the "yy" dotted line, and side view 830 in FIG. 8C is along the "xx" dotted line shown in top view 800 of FIG. 8A. In some embodiments, conformal dielectric layer (ILD) 801 is deposited to prevent current going through etched magnet sidewalls to the to-be formed channel. In this example, the channel is to be formed along the dotted line "yy."

FIGS. 9A-C illustrate top view 900 and side views (920 and 930) of the stack with channel and pad resist deposition, according to some embodiments of the disclosure. It is pointed out that those elements of FIGS. 9A-C having the same reference numbers (or names) as the elements of any other figure can operate or function in any manner similar to that described, but are not limited to such. Here, side view 920 in FIG. 9B is along the "yy" dotted line through the middle of the stack shown in top view 900 of FIG. 9A, while side view 930 in FIG. 9C is along the "xx" dotted line. In some embodiments, channel and/or pad resist 901 is deposited. In some cases, negative tone may be preferred for electron-beam writers.

FIGS. 10A-C illustrate top view 1000 and side views (1020 and 1030) of the stack with timed etch to expose ILD on top of the non-magnet conductive layer without etching the magnet sidewalls, according to some embodiments of the disclosure. It is pointed out that those elements of FIGS. 10A-C having the same reference numbers (or names) as the elements of any other figure can operate or function in any manner similar to that described, but are not limited to such. Here, side view 1020 in FIG. 10B is along the "yy" dotted line through the middle of the stack shown in top view 1000 of FIG. 10A, while side view 1030 in FIG. 10C is along the "xx" dotted line.

In this process, the interface between the in-situ deposited non-magnet conductive layer 103 and the spin channel is fabricated. In some embodiments, the interface between in-situ non-magnet conductive layer 103 and the spin channel is also chemically cleaned to ensure spin and charge contact. In some embodiments, ILD 801 is etched to expose top of non-magnet conductive layer 103. In some embodiments, when ILD 801 is etched, the sidewalls of magnet 102 and non-magnet conductive layer 103 are not cleared (i.e., the sidewalls remain covered with ILD 801). In some embodiments, as ILD 801 is timed etched, parts of substrate 101 are exposed.

Here, the term "timed" generally refers to the process of etching that is applied for a certain time to remove the thin cap of ILD material on the top surfaces of the metals. In some embodiments, the etch process may be used to only remove the thickness of material deposited on the top of the metal so that the plug of material 801 is left to protect the side walls of the magnet. If for example, an arbitrarily long etch is performed, all the material including the desired plug of material that protects the sidewall 801 may be removed. The process works because the ILD material is conformal (i.e., deposits the same thickness of the material on any surface—side, top, or bottom) but that the etch is directional—only removes material from one direction—straight down. If the etch process is isotropic, then the process of removing the same amount of material along any direction (i.e., side, top or bottom) may not work. Here, 1001 is the remaining resist. Some of it might get consumed during the ILD etch, but in principle it should still stick around to guide where the etch attacks the patterned structures.

FIGS. 11A-C illustrate top view 1100 and side views (1120 and 1130) of the stack with channel and pad deposition, according to some embodiments of the disclosure. It is pointed out that those elements of FIGS. 11A-C having the same reference numbers (or names) as the elements of any other figure can operate or function in any manner similar to that described, but are not limited to such. The side view 1120 in FIG. 11B is along the "yy" dotted line through the middle of the stack shown in top view 1100 of FIG. 11A, while side view 1130 in FIG. 11C is along the "xx" dotted line.

After ILD 801 is timed etched, another non-magnet conductive material 1101 (also referred to here as the second non-magnet conductive material) is deposited. Non-magnet conductive material 1101 forms the channel and pad. In some embodiments, the channel and pads are deposited simultaneously to reduce parasitic contact resistances. In some embodiments, non-magnet conductive material 1101 is the same material as non-magnet conductive material 103. In some embodiments, non-magnet conductive material 1101 is different material from non-magnet conductive material 103. The process of FIGS. 11A-C can also be used to form other interconnects. In some embodiments, the breaks or roughness between the interface of non-magnet conductive materials 103 and 1101 can be healed through proper annealing.

FIGS. 11D-F illustrate top 1140 and side views (1150 and 1160) of the stack after lift-off of resist 1001, according to some embodiments of the disclosure. It is pointed out that those elements of FIGS. 11D-F having the same reference numbers (or names) as the elements of any other figure can operate or function in any manner similar to that described, but are not limited to such. The side view 1150 in FIG. 11E is along the "yy" dotted line through the middle of the stack shown in top view 1140 of FIG. 11D, while side view 1160 in FIG. 11F is along the "xx" dotted line.

FIGS. 12-18 together describe an alternate process flow with lift-off process, according to some embodiments. This process also allows for preservation (or protection) of the quality of the interface between a magnetic material (used for spin polarization) and a channel (a non-magnetic material used for transmission of spin-polarized electrons), according to some embodiments. Each figure shows top and side views of the stack after a certain process is complete.

Although FIGS. 12-18 are shown in a particular order, the order of the actions can be modified. Thus, the illustrated embodiments can be performed in a different order, and some processes may be performed in parallel. Some of the processes and/or operations listed in FIGS. 12-18 are optional in accordance with certain embodiments. The numbering of the figures presented is for the sake of clarity and is not intended to prescribe an order of operations in which the various processes must occur. Additionally, operations from the various process flows may be utilized in a variety of combinations.

FIGS. 12A-C illustrate top view 1200 and side views (1220 and 1230) of a stack having a substrate with resist disposition, according to some embodiments of the disclosure. It is pointed out that those elements of FIGS. 12A-C having the same reference numbers (or names) as the elements of any other figure can operate or function in any manner similar to that described, but are not limited to such. Here, side view 1220 in FIG. 12B is along the "yy" dotted line, and side view 1230 in FIG. 12C is along the "xx" dotted line shown in top view 1200 of FIG. 12A. The process begins with forming a magnet pattern over substrate 1201 by depositing a photo resist 1202. Substrate 1201 can be any of the materials as discussed with reference to substrate 101.

FIGS. 13A-C illustrate top view 1300 and side views (1320 and 1330) of the stack with magnet and thin channel deposition, according to some embodiments of the disclosure. It is pointed out that those elements of FIGS. 13A-C having the same reference numbers (or names) as the elements of any other figure can operate or function in any manner similar to that described, but are not limited to such. Here, side view 1320 in FIG. 13B is along the "yy" dotted line, and side view 1330 in FIG. 13C is along the "xx" dotted line shown in top view 1300 of FIG. 13A.

In some embodiments, after photo resist 1202 is deposited and the magnet pattern is identified, magnet 1302 and non-magnet conductive material 1301 is deposited in-situ over substrate 1201 and photo resist 1202 such that the interface between magnet 1302 and non-magnet conductive material 1301 is preserved (i.e., the interface is smooth). Magnet 1302 can be any of the materials discussed with reference to magnet 102. Non-magnet conductive material 1301 can be any of the materials discussed with reference to non-magnet conductive material 103.

FIGS. 14A-C illustrate top view 1400 and side views (1420 and 1430) of the stack after lift-off, according to some embodiments of the disclosure. It is pointed out that those elements of FIGS. 14A-C having the same reference numbers (or names) as the elements of any other figure can operate or function in any manner similar to that described, but are not limited to such. Here, side view 1420 in FIG. 14B is along the "yy" dotted line, and side view 1430 in FIG. 14C is along the "xx" dotted line shown in top view 1400 of FIG. 14A.

In some embodiments, the process of lift-off is performed after depositing magnet 1302 and non-magnet conductive layer 1301. In some embodiments, after lift-off, the magnet 1302 and non-magnet conductive material 1302 over the defined magnet regions are left exposed. During lift-off, regions covered with resist 1202 are removed leaving behind substrate 1201 and the defined magnet "bar" regions.

FIGS. 15A-C illustrate top view 1500 and side views (1520 and 1530) of the stack after resist deposition and selective etching to form patterns for channel and pad, according to some embodiments of the disclosure. It is pointed out that those elements of FIGS. 15A-C having the same reference numbers (or names) as the elements of any other figure can operate or function in any manner similar to that described, but are not limited to such. Here, side view 1520 in FIG. 15B is along the "yy" dotted line through the middle of the stack shown in top view 1500 of FIG. 15A, while side view 1530 in FIG. 15C is along the "xx" dotted line.

In some embodiments, after lift-off, channel and/or pad patterns are formed by resist 1501. The resist 1501 is deposited such that some regions of non-magnet conductive material 1301 remain exposed for pad and channel formation. In this example, the channel is formed along the dotted line "yy."

FIGS. 16A-C illustrate top 1600 and side views (1620 and 1630) of the stack after thick channel metal deposition, according to some embodiments of the disclosure. It is pointed out that those elements of FIGS. 16A-C having the same reference numbers (or names) as the elements of any other figure can operate or function in any manner similar to that described, but are not limited to such. Here, side view 1620 in FIG. 16B is along the "yy" dotted line, and side view 1630 in FIG. 16C is along the "xx" dotted line shown in top view 1600 of FIG. 16A.

In some embodiments, after depositing resist 1301, a thick layer of another non-magnet conductive layer 1601 (which may be the same material as non-magnet conductive layer 1301) is deposited over the entire region. In some embodiments, non-magnet conductive layer 1301 is formed of a material different than non-magnet conductive layer 1601. Non-magnet conductive layer 1601 is thicker than non-magnet conductive layer 1301. For example, non-magnet conductive layer 1601 is 150 nm thick and non-magnet conductive layer 1301 is 30 nm thick.

FIGS. 17A-C illustrate top view 1700 and side views (1720 and 1730) of the stack after lift-off of region defined by the resist deposition, according to some embodiments of the disclosure. It is pointed out that those elements of FIGS. 17A-C having the same reference numbers (or names) as the elements of any other figure can operate or function in any manner similar to that described, but are not limited to such. Here, side view 1720 in FIG. 17B is along the "yy" dotted line, and Side view 1730 in FIG. 17C is along the "xx" dotted line shown in top view 1700 of FIG. 17A, while side view 1730 in FIG. 17C is along the "xx" dotted line.

In some embodiments, after depositing non-magnet conductive layer 1601, thin layer of non-magnet conductive layer 1301 is outlined (the dotted region) and the remainder region is identified as non-magnet conductive layer 1601. In some embodiments, after depositing the non-magnet conductive layer 1601, the process of lift-off repeated. After lift-off (i.e., between FIG. 16A and FIG. 17A) there are regions of both thin and thick non-magnet conductive layers 1301 and 1601, respectively.

FIGS. 18A-C illustrate top view 1800 and side views (1820 and 1830) of the stack after selective etch of non-magnet conductive material, according to some embodiments of the disclosure. It is pointed out that those elements of FIGS. 18A-B having the same reference numbers (or names) as the elements of any other figure can operate or function in any manner similar to that described, but are not limited to such. Here, side view 1820 in FIG. 18B is along the "yy" dotted line through the middle of the stack shown in top view 1800 of FIG. 18A, while side view 1830 in FIG. 18C is along the "xx" dotted line.

In some embodiments, after lift-off, the non-magnet conductive layers, 1301 and 1601, are selectively etched using a specific time to completely remove only the exposed portions of the thin non-magnet conductive layer 1301 layer on top of magnet 1302. As a cost of doing this timed etch process, the non-magnetic material 1601 (if of the same material at 1301) will also be reduced in thickness by the same value, according to some embodiments. But since the non-magnetic material 1601 started out much thicker than non-magnetic material 1301, there will still be plenty of the non-magnetic material 1601 after the etch process is complete, according to some embodiments. The remaining non-magnetic material 1601 will form the conductive channel and interconnect pads of the device, according to some embodiments.

To seek a way to continue integrated circuit (IC) scaling and make computation more energy efficient, spintronic devices can be used. In spintronic devices, electron spins carry and store the information. One feature of such devices is their non-volatility (i.e., the computational state is preserved even when power to the circuit is turned off). This feature opens a path to normally-off, instantly-on logic chips which consume much less static power and thus are very desirable for mobile systems. Another feature of spintronic devices is that a collective state of particles (rather than individual electrons) experiences switching. Thus, spintronic devices have a much lower limit of switching energy per bit. The supply voltage of a spintronic device may not be related to leakage current and can be reduced to tens of millivolts. This leads to lower active power.

One example of spintronic devices is an all-spin logic (ASL) device. FIG. 19A illustrates a side view 1900 of a lateral spin logic device side enabled in-situ process flow, according to some embodiments of the disclosure. Side view 1900 illustrates first layer 1901 of non-magnetic material (e.g., Cu), via 1902 (e.g., Cu), oxide 1903, second layer 1904 of non-magnetic material (e.g., Cu), ferromagnetic layer 1905 formed in-situ with non-magnetic material (e.g., Cu) capping 1906/1907, and third layer 1907 of non-magnetic material (e.g., Cu) coupled together as shown.

FIG. 19B illustrate a bit schematic view 1920 of lateral spin logic device 1900 (e.g., an ASL device) enabled by the in-situ process, according to some embodiments of the disclosure. It is pointed out that those elements of FIG. 19B having the same reference numbers (or names) as the elements of any other figure can operate or function in any manner similar to that described, but are not limited to such.

The ASL device 1920 includes ferromagnets (FM) 1921a and 1921b with respective terminals. In this example, the respective terminals are coupled to power supply (Vdd). FM 1921a and FM 1921b extend in the x-direction (also called first direction). In ASL, each FM (e.g. 1921a) has an output ("right") side (e.g., its interface with the channel portion 1922b) and an input ("left") side (e.g., its interface with the channel portion 1922a), separated by spacer 1924a. Similar structure exists for other ferromagnets (e.g. 1921b). Spacers 1924a and 1924b are made from insulating material. Conducting non-magnetic (NM) metal channels 1922 connect the output side of the previous stage FM and the input side of the next stage FM. The conducting NM channel 1922 is deposited in-situ on the FMs 1921a and 1921b, and the ASL device is fabricated using the process described with reference to several embodiments.

Coupled to the right side of each spacer are other NM 1923a and NM 1903b which are coupled to ground (Vss). In one embodiment, tunneling barrier on the input side can be removed which is easier to fabricate and has a smaller resistance in the spin injection path. ASL devices operate by spin-polarized currents flowing through a non-magnetic metal channel from the output side of a driving FM, and resulting in spin transfer torque (STT) exerted on the input side of a driven FM. The magnitude and direction of torques determine the final state of magnetization in the driven FMs.

The majority of magnetic moments of electrons in an FM (1921a and/or 1921b) points in the direction of magnetization. The x, y, and z unit vectors in FIG. 19B show the positive directions for each axis. The FM dimensions are selected such that its easy and hard axes are x-axis and z-axis, respectively. The magnetization of every FM has two stable states—in either the positive (+x) and negative (-x) direction. When its magnetization points in +x direction, it is treated as logic 1; and when it points in -x direction, it is treated as logic 0. Furthermore, in FIG. 19B the non-magnetic metal wires 1922 are channels, and 1923a/1923b are ground leads. Spacers 1924a/1924b prevent currents flowing from one channel (e.g., first portion 1922a) to the next (i.e., second portion 1922b). Vdd and Vss are the power supply voltage and the ground voltage, respectively.

The non-reciprocity (i.e., input/output distinction) in ASL devices, for logic implementation, is enabled by placing the ground lead (e.g., 1923a) closer to one of the FMs (e.g., 1921a). Similarly, FM 1921b is closer to the ground lead 1923b. For the portion of the channel 1922b, the driving FM is 1921a and the driven FM is 1921b. Even though the areas of the input and output sides may be designed to be identical, the ground lead (e.g., 1923b) is close to the output side of every FM (e.g., 1921b). Therefore, the resistance from Vdd to Vss is smaller on the output side (i.e., path through 1921a, 1922b, and 1923b) than on the input side (i.e., path through 1921b, 1922b, and 1923b), and the current is larger at the output side. Thus, the spin-polarized density is larger on the output side than that on the input side. That creates a net spin-polarized current from the output side of the driving FM 1921a to the input side of the driven FM 1921b. By these means multiple ASL devices can be cascaded input-to-output, without additional converting stages (i.e., concatenability).

In addition, FMs 1921a and 1921b have two stable, low energy states (e.g., magnetization in +x and -x directions), and spin dissipation causes magnetization to evolve toward the stable states. Therefore, the output of each stage starts in one of these stable states. In other words, the spin signal does not degrade from stage to stage and can be regenerated from relatively small spin-polarized currents if they are above the threshold value determined by the FM energy barrier (i.e., amplification). These properties make ASL devices suitable for logic implementations.

For positive supply voltages, electrons traverse from Vss to Vdd. FMs 1921a/1921b extract electrons from 1922 with magnetic moments polarized in the same direction as their magnetization. This leaves the accumulation of spins with opposite magnetic moments in 1922 under FMs 1921a/1921b. Due to channel 1922 resistance and the position of the ground lead (1923a), the charge current in the output side is much higher than that in the input side. Thus, the accumulated density of spins is higher on the output side. Electrons diffuse from output to the input side and exert STT on the driven FM. If STT is over a certain threshold value, the driven FM magnetization switches to the direction opposite to the driving FM magnetization. Hence, ASL device 1920 shown in FIG. 19B operates as an inverter for positive supply voltages. Similarly, for negative supply voltages the device operates as a buffer, and the magnetization of the driven FM follows ("copies") that of the driving FM.

FIG. 20 illustrates a low width lateral spin valve 2000 used as a read head sensor enabled by the in-situ process, according to some embodiments of the disclosure. In this example, recording medium formed of magnets is used to store data. Data is written into the recording medium via an inductive write element. To read data, a low width lateral spin valve is used as a read head sensor. This read head sensor, in some embodiments, is formed using the in-situ process described in various embodiments.

Figure 21A:
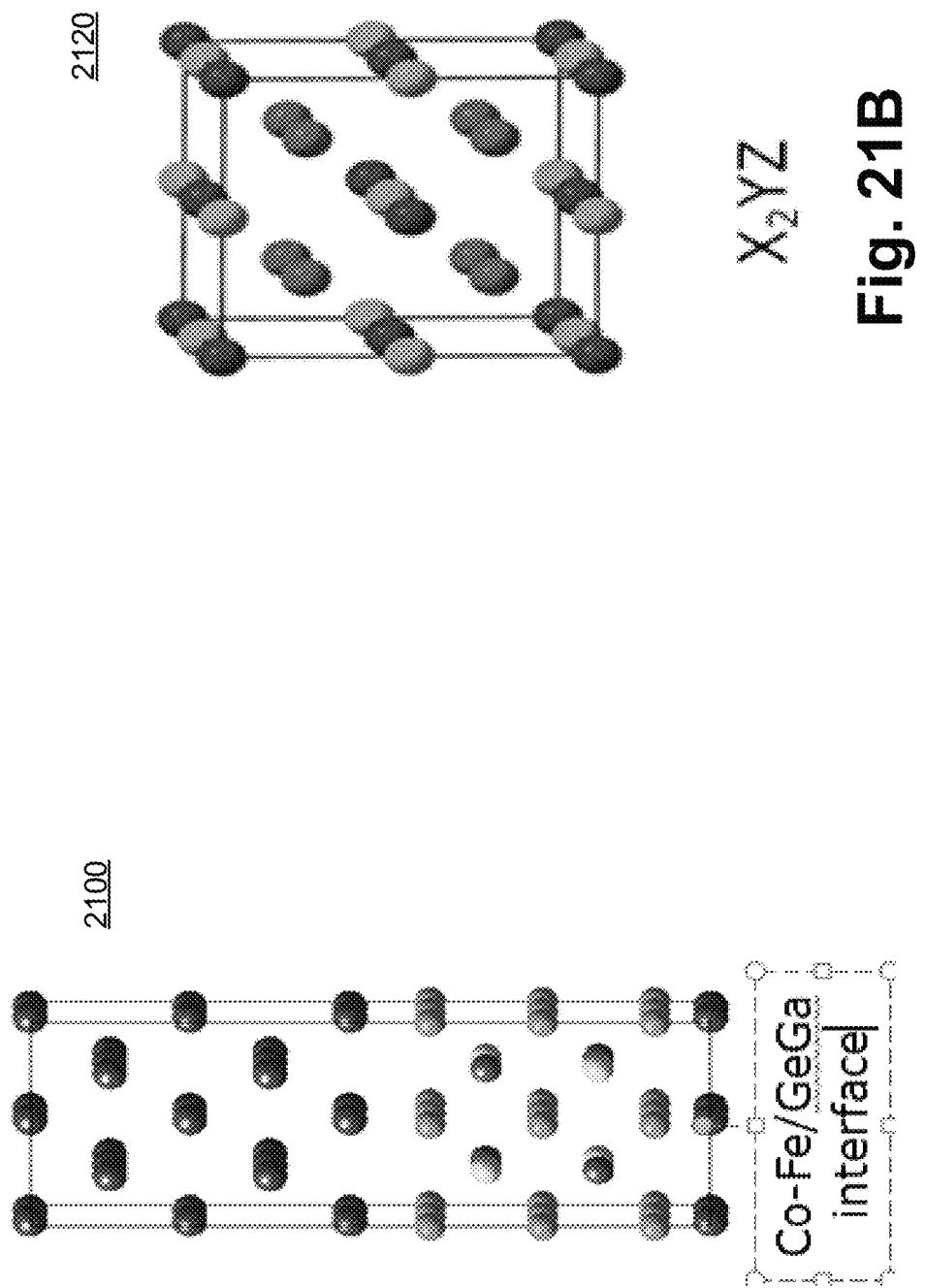

FIGS. 21A-B illustrates images 2100 and 2120 of formation of a magnetic texture that can be seen by Transmission Electron Microscopy (TEM). In some embodiments, a different structure is targeted for each magnetic material and substrate choice. Image 2100 is for $Co_2FeGeGa$. Here, the crystallography attempted is: Ag Face-Centered-Cubic (FCC) a=4.05 A, 225 space group, CFGG a=5.737 A a/sqrt(2)=4.067 A 225 space group, where 'a' is a lattice constant. There are number of such ideal interfaces each with a specific orientation and structure. For a generic Heusler alloy, the attempted structure is provided by 2200.

In some embodiments, the lattice constant of a material forming the interface of the layer of the non-magnet conductive material (e.g., one of: Cu Ag, Al, Au, Bi, BiSe, BiAu, Cu alloyed or doped with Ir, Os, Bi, or Si) is in a range of 3 A to 10 A. In some embodiments, the lattice constant of a material forming the interface of the magnet is in a range of 3 A to 10 A. In some embodiments, a crystal structure of the magnet belongs to a Heusler phase characterized by X2 YZ or X2 YZ0.5P0.5.

Figure 22:
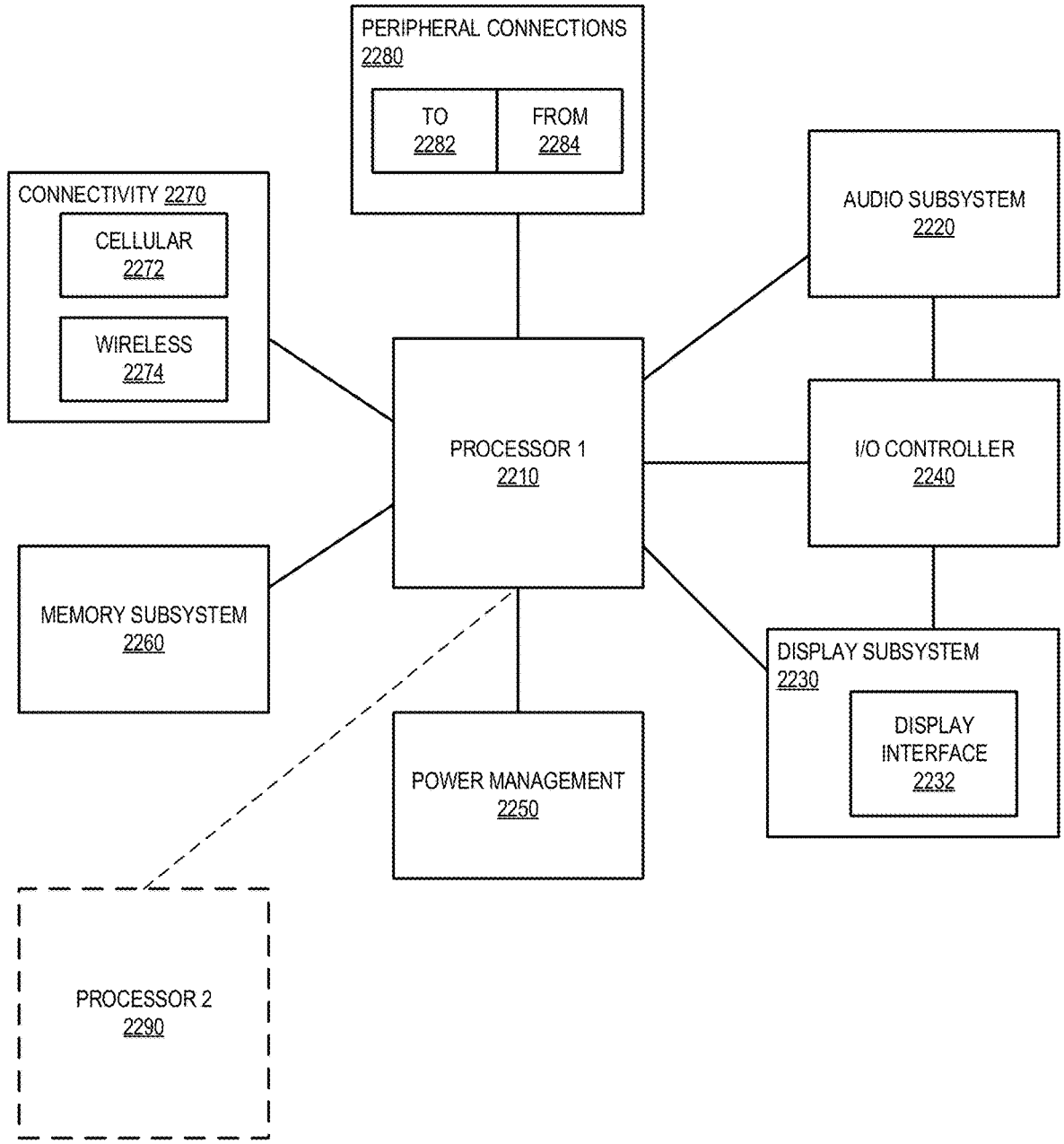
FIG. 22 illustrates a smart device or a computer system or a SoC (System-on-Chip) with lateral spin logic devices formed from in-situ deposited magnetic stacks, according to some embodiments.

FIG. 22 is a smart device or a computer system or a SoC (System-on-Chip) with lateral spin logic devices formed from in-situ deposited magnetic stacks, according to some embodiments. It is pointed out that those elements of FIG. 22 having the same reference numbers (or names) as the elements of any other figure can operate or function in any manner similar to that described, but are not limited to such.

FIG. 22 illustrates a block diagram of an embodiment of a mobile device in which flat surface interface connectors could be used. In some embodiments, computing device 2200 represents a mobile computing device, such as a computing tablet, a mobile phone or smart-phone, a wireless-enabled e-reader, or other wireless mobile device. It will be understood that certain components are shown generally, and not all components of such a device are shown in computing device 2200.

In some embodiments, computing device 2200 includes a first processor 2210 with lateral spin logic devices formed from in-situ deposited magnetic stacks, according to some embodiments discussed. Other blocks of the computing device 2200 may also include the lateral spin logic devices formed from in-situ deposited magnetic stacks of some embodiments. The various embodiments of the present disclosure may also comprise a network interface within 2270 such as a wireless interface so that a system embodiment may be incorporated into a wireless device, for example, cell phone or personal digital assistant.

In one embodiment, processor 2210 (and/or processor 2290) can include one or more physical devices, such as microprocessors, application processors, microcontrollers, programmable logic devices, or other processing means. The processing operations performed by processor 2210 include the execution of an operating platform or operating system on which applications and/or device functions are executed. The processing operations include operations related to I/O (input/output) with a human user or with other devices, operations related to power management, and/or operations related to connecting the computing device 2200 to another device. The processing operations may also include operations related to audio I/O and/or display I/O.

In one embodiment, computing device 2200 includes audio subsystem 2220, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2200, or connected to the computing device 2200. In one embodiment, a user interacts with the computing device 2200 by providing audio commands that are received and processed by processor 2210.

Display subsystem 2230 represents hardware (e.g., display devices) and software (e.g., drivers) components that provide a visual and/or tactile display for a user to interact with the computing device 2200. Display subsystem 2230 includes display interface 2232, which includes the particular screen or hardware device used to provide a display to a user. In one embodiment, display interface 2232 includes logic separate from processor 2210 to perform at least some processing related to the display. In one embodiment, display subsystem 2230 includes a touch screen (or touch pad) device that provides both output and input to a user.

I/O controller 2240 represents hardware devices and software components related to interaction with a user. I/O controller 2240 is operable to manage hardware that is part of audio subsystem 2220 and/or display subsystem 2230. Additionally, I/O controller 2240 illustrates a connection point for additional devices that connect to computing device 2200 through which a user might interact with the system. For example, devices that can be attached to the computing device 2200 might include microphone devices, speaker or stereo systems, video systems or other display devices, keyboard or keypad devices, or other I/O devices for use with specific applications such as card readers or other devices.

As mentioned above, I/O controller 2240 can interact with audio subsystem 2220 and/or display subsystem 2230. For example, input through a microphone or other audio device can provide input or commands for one or more applications or functions of the computing device 2200. Additionally, audio output can be provided instead of, or in addition to display output. In another example, if display subsystem 2230 includes a touch screen, the display device also acts as an input device, which can be at least partially managed by I/O controller 2240. There can also be additional buttons or switches on the computing device 2200 to provide I/O functions managed by I/O controller 2240.

In one embodiment, I/O controller 2240 manages devices such as accelerometers, cameras, light sensors or other environmental sensors, or other hardware that can be included in the computing device 2200. The input can be part of direct user interaction, as well as providing environmental input to the system to influence its operations (such as filtering for noise, adjusting displays for brightness detection, applying a flash for a camera, or other features).

In one embodiment, computing device 2200 includes power management 2250 that manages battery power usage, charging of the battery, and features related to power saving operation. Memory subsystem 2260 includes memory devices for storing information in computing device 2200. Memory can include nonvolatile (state does not change if power to the memory device is interrupted) and/or volatile (state is indeterminate if power to the memory device is interrupted) memory devices. Memory subsystem 2260 can store application data, user data, music, photos, documents, or other data, as well as system data (whether long-term or temporary) related to the execution of the applications and functions of the computing device 2200.

Elements of embodiments are also provided as a machine-readable medium (e.g., memory 2260) for storing the computer-executable instructions (e.g., instructions to implement any other processes discussed herein). The machine-readable medium (e.g., memory 2260) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2270 includes hardware devices (e.g., wireless and/or wired connectors and communication hardware) and software components (e.g., drivers, protocol stacks) to enable the computing device 2200 to communicate with external devices. The computing device 2200 could be separate devices, such as other computing devices, wireless access points or base stations, as well as peripherals such as headsets, printers, or other devices.

Connectivity 2270 can include multiple different types of connectivity. To generalize, the computing device 2200 is illustrated with cellular connectivity 2272 and wireless connectivity 2274. Cellular connectivity 2272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2274 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2280 include hardware interfaces and connectors, as well as software components (e.g., drivers, protocol stacks) to make peripheral connections. It will be understood that the computing device 2200 could both be a peripheral device ("to" 2282) to other computing devices, as well as have peripheral devices ("from" 2284) connected to it. The computing device 2200 commonly has a "docking" connector to connect to other computing devices for purposes such as managing (e.g., downloading and/or uploading, changing, synchronizing) content on computing device 2200. Additionally, a docking connector can allow computing device 2200 to connect to certain peripherals that allow the computing device 2200 to control content output, for example, to audiovisual or other systems.

In addition to a proprietary docking connector or other proprietary connection hardware, the computing device 2200 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus a method is provided which comprises: forming a magnet on a substrate or a template, the magnet having an interface; and forming a first layer of non-magnet conductive material on the interface of the magnet such that the magnet and the layer of non-magnet conductive material are formed in-situ. In some embodiments, the method comprises: selectively etching the first layer. In some embodiments, the method comprises: defining the position of spin channel and access interconnecting structures on the selectively etched first layer. In some embodiments, the method comprises: simultaneously depositing the spin channel and the access interconnecting structures to reduce parasitic contact resistance.

In some embodiments, the method comprises: forming a second layer of non-magnet conductive material over the first layer, the second layer forming a spin channel. In some embodiments, the method comprises: cleaning an interface between the first and second layers of the non-magnet conductive material to provide spin and charge contact. In some embodiments, the method comprises: annealing the formed magnet after cleaning the interface. In some embodiments, the first and second layers are formed using different masks or combination of masks.

In some embodiments, forming the magnet comprises epitaxially growing the magnet on the template. In some embodiments, the substrate is one of: MgO, STO, BFO, Ag, $GdSeO_3$, Nb:STO, or $DyScO_3$. In some embodiments, the non-magnet conductive material is one of: Cu Ag, Al, Au, Bi, BiSe, BiAu, Cu alloyed or doped with Ir, Os, Bi, or Si. In some embodiments, the first layer of non-magnet conductive material on the interface of the magnet is formed such that the interface of the magnet is not exposed to air or impurities.

In some embodiments, the magnet is formed under crystallographic, electromagnetic, or thermodynamic conditions. In some embodiments, the method comprises annealing the formed magnet after forming the first layer of non-magnet conductive material on the interface of the magnet. In some embodiments, a lattice constant of a material forming the interface of the first layer of the non-magnet conductive material is in a range of 3 A to 10 A. In some embodiments, a lattice constant of a material forming the interface of the magnet is in a range of 3 A to 10 A. In some embodiments, a crystal structure of the magnet belongs to a Heusler phase characterized by X2 YZ or X2 YZ0.5P0.5.

In another example, an apparatus is provided which comprises: a magnet formed on a substrate or a template, the magnet being formed under crystallographic, electromagnetic, or thermodynamic conditions, the magnet having an interface; and a first layer of non-magnet conductive material formed on the interface of the magnet such that the magnet and the layer of non-magnet conductive material are formed in-situ. In some embodiments, the first layer is selectively etched along with the magnet. In some embodiments, the apparatus comprises a spin channel and a pad formed on the selectively etched first layer. In some embodiments, the apparatus comprises a second layer of non-magnet conductive material formed over the first layer, the second layer forming a spin channel. In some embodiments, the apparatus comprises: a spin and charge contact provided by cleaning an interface between the first and second layers of non-magnet conductive material.

In some embodiments, the substrate is one of: MgO, STO, BFO, Ag, $GdSeO_3$, Nb:STO, or $DyScO_3$. In some embodiments, the non-magnet conductive material is one of: Cu Ag, Al, Au, Bi, BiSe, BiAu, Cu alloyed or doped with Ir, Os, Bi, or Si. In some embodiments, the first layer of non-magnet conductive material on the interface of the magnet is formed in vacuum. In some embodiments, a lattice constant of a material forming the interface of the first layer of the non-magnet conductive material is in a range of 3 A to 10 A. In some embodiments, a lattice constant of a material forming the interface of the magnet is in a range of 3 A to 10 A. In some embodiments, a crystal structure of the magnet belongs to a Heusler phase characterized by X2 YZ or X2 YZ0.5P0.5.

In another example, a system is provided which comprises: a processor; a memory having lateral spin value devices, at least one of which comprises an apparatus according to the apparatus described above; and a wireless interface for allowing the processor to communicate with another device. In some embodiments, the system comprises: a display interface for coupling to a display unit, the display interface to provide content processed by the processor for displaying by the display unit. In some embodiments, the system comprises: a magnetic sensor to sense magnetic fields from the memory. In some embodiments, the magnetic sensor comprises a lateral spin valve for reading data from the memory.

In another example, an apparatus is provided which comprises: means for forming a magnet on a substrate or a template, the magnet having an interface; and means for forming a first layer of non-magnet conductive material on the interface of the magnet such that the magnet and the layer of non-magnet conductive material are formed in-situ. In some embodiments, the apparatus comprises: means for forming selectively etching the first layer. In some embodiments, the apparatus comprises: means for forming defining the position of spin channel and access interconnecting structures on the selectively etched first layer. In some embodiments, the apparatus comprises: means for forming simultaneously depositing the spin channel and the access interconnecting structures to reduce parasitic contact resistance.

In some embodiments, the apparatus comprises: means for forming a second layer of non-magnet conductive material over the first layer, the second layer forming a spin channel. In some embodiments, the apparatus comprises: means for forming cleaning an interface between the first and second layers of the non-magnet conductive material to provide spin and charge contact. In some embodiments, the first and second layers are formed using different masks or combination of masks. In some embodiments, the means for forming the magnet comprises means for epitaxially growing the magnet on the template. In some embodiments, the substrate is one of: MgO, STO, BFO, Ag, $GdSeO_3$, Nb:STO, or $DyScO_3$. In some embodiments, the non-magnet conductive material is one of: Cu Ag, Al, Au, Bi, BiSe, BiAu, Cu alloyed or doped with Ir, Os, Bi, or Si.

In some embodiments, the first layer of non-magnet conductive material on the interface of the magnet is formed such that the interface of the magnet is not exposed to air or impurities. In some embodiments, the magnet is formed under crystallographic, electromagnetic, or thermodynamic conditions. In some embodiments, the apparatus comprises: means for annealing the formed magnet after forming the first layer of non-magnet conductive material on the interface of the magnet.

In some embodiments, a lattice constant of a material forming the interface of the first layer of the non-magnet conductive material is in a range of 3 A to 10 A. In some embodiments, a lattice constant of a material forming the interface of the magnet is in a range of 3 A to 10 A. In some embodiments, a crystal structure of the magnet belongs to a Heusler phase characterized by X2 YZ or X2 YZ0.5P0.5.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
    forming a magnet on a substrate or a template, the magnet having an interface, wherein the interface of the magnet has a lattice constant in a range of 3 A to 10 A; and
    forming a first layer of non-magnet conductive material on the interface of the magnet;
    forming a second layer of non-magnet conductive material over the first layer, the second layer forming a spin channel; and
    forming a contact between the first and second layers.

2. The method of claim 1 comprising selectively etching the first layer.

3. The method of claim 2 comprising defining the position of spin channel and access interconnecting structures on the selectively etched first layer.

4. The method of claim 3 comprising simultaneously depositing the spin channel and the access interconnecting structures to reduce parasitic contact resistance.

5. The method of claim 1 comprising cleaning an interface between the first and second layers of the non-magnet conductive material to provide spin and charge contact.

6. The method of claim 5 comprises annealing the formed magnet after cleaning the interface.

7. The method of claim 1, wherein the first and second layers are formed using different masks or combination of masks.

8. The method of claim 1, wherein forming the magnet comprises epitaxially growing the magnet on the template.

9. The method of claim 1, wherein the substrate includes one of: MgO, STO, BFO, Ag, GdSeO$_3$, Nb:STO, or DyScO$_3$.

10. The method of claim 1, wherein the non-magnet conductive material includes one of: Cu Ag, Al, Au, Bi, BiSe, BiAu, Cu alloyed or doped with Ir, Os, Bi, or Si.

11. The method of claim 1, wherein the first layer of non-magnet conductive material on the interface of the magnet is formed such that the interface of the magnet is not exposed to air or impurities.

12. The method of claim 1, wherein a crystal structure of the magnet belongs to a Heusler phase characterized by X2 YZ or X2 YZ0.5P0.5.

13. The method of claim 1 comprises annealing the formed magnet after forming the first layer of non-magnet conductive material on the interface of the magnet.

14. A spin logic apparatus comprising:
    a magnet on a substrate or a template, the magnet having an interface;
    a first layer of non-magnet conductive material on the interface of the magnet;
    a second layer of non-magnet conductive material over the first layer, the second layer being a spin channel; and
    a contact between the first and second layers, wherein the interface of the magnet has a lattice constant in a range of 3A to 10 A.

15. The apparatus of claim 14, wherein the first layer is selectively etched along with the magnet.

16. The apparatus of claim 15 comprising a spin channel, wherein the spin channel and a pad are on the first layer.

17. The spin logic apparatus of claim 14, wherein the substrate or template includes one of: Si, Mg, B, F, Ag, Gd, Sc, Nb, Dy, or Sc.

18. The spin logic apparatus of claim 14, wherein the magnet has a crystal structure having a Heusler phase characterized by X2 Y2.

* * * * *